United States Patent [19]
Bauernfeind et al.

[11] Patent Number: 5,187,432
[45] Date of Patent: Feb. 16, 1993

[54] ENVIRONMENTAL STRESS SCREENING PROCESS

[75] Inventors: Wolfgang J. Bauernfeind, Thornton; Frank T. Beard, Westminster; Edwin Z. Brown, Westminster; Craig E. McMurray, Westminster; Joseph E. Pigg, Firestone, all of Colo.

[73] Assignee: AT&T Bell Laboratories, Murray Hill, N.J.

[21] Appl. No.: 784,206

[22] Filed: Oct. 28, 1991

[51] Int. Cl.⁵ ..................... G01R 31/02; H01L 23/44
[52] U.S. Cl. ........................... 324/158 R; 324/158 F; 361/385; 165/80.4
[58] Field of Search ............. 324/158 R, 73.1, 158 F, 324/158 P; 73/865.6; 374/45, 57; 361/384, 385; 165/80.4

[56] References Cited

U.S. PATENT DOCUMENTS

| | | | |
|---|---|---|---|
| 3,761,808 | 9/1973 | Ryan | 324/158 F |
| 4,706,208 | 11/1987 | Helms | 371/16.1 |
| 4,812,750 | 3/1989 | Keel et al. | 324/158 F |
| 4,854,726 | 8/1989 | Lesley et al. | 73/865.6 |
| 4,949,031 | 8/1990 | Szasz et al. | 324/158 P |
| 5,004,973 | 4/1991 | Taraci et al. | 324/158 R |
| 5,039,228 | 8/1991 | Chalmers | 73/865.6 |

OTHER PUBLICATIONS

Certificate of Copyright Registration #TXU476724; Thermodynamic Engineering Inc.; Jun. 20, 1991.
Certificate of Copyright Registration #TXU476689; Thermodynamic Engineering Inc.; Jun. 20, 1991.

Primary Examiner—Vinh Nguyen
Attorney, Agent, or Firm—John C. Moran

[57] ABSTRACT

A method that stress assembled circuit boards well beyond normal operational limits both with respect to supply voltages and temperature cycling. The circuit boards are transferred between a cold bath of inert liquid and a hot bath of inert liquid while the power voltages are being applied for short periods of time at voltages which exceed the nominal voltages of the devices. The circuit boards are transferred from the hot bath to the cold bath or vice versa in less than 30 seconds, and maximum stresses are achieved without damaging parts or the circuit boards.

10 Claims, 3 Drawing Sheets

5,187,432

ENVIRONMENTAL STRESS SCREENING PROCESS

TECHNICAL FIELD

The present invention relates to environmental screening of electronic circuit boards.

BACKGROUND OF THE INVENTION a well known problem in the manufacturing of electronic circuit boards is early failures which are referred to as infant failures. Statistically, the majority of the electrical devices that will fail in the first ten years will fail during the first year of operation. To reduce these failures and associated warranty cost, manufacturers perform burn-in tests. Such tests can eliminate the majority of the electrical devices that will fail during the first year of operation. During a burn-in test, the devices are subjected to elevated thermal or electrical operating conditions for a long period of time, typically, one to eight weeks, thereby simulating one year of operation under normal conditions.

The prior art has utilized different techniques to increase the reliability of the burn-in test. For example, U.S. Pat. No. 5,004,973 utilizes a bath of an inert liquid having a boiling point less than the desired temperature at which the electrical device is to be operated for testing purposes. This technique allows the device to be operated at the highest possible temperature without the device being destroyed. Since the temperature at which the device must be operated is often unique to a particular device, the technique of this latter patent does not work well on a circuit board having different types of devices. Further, the tests still require an extended amount of time.

It is also known in the prior art to vary the temperature at which a device is operating over a temperature range by changing the temperature of the air within a environmental test chamber. The range of air temperatures vary from the normal operating temperature of the device to its normal off-state temperature. Such a chamber is disclosed in U.S. Pat. No. 4,812,750. At the same time as the temperature is being varied, the power to the electronic components is turned on and off. It is a well known phenomenon that turning the power on and off does stress the component to a certain extent. In addition, U.S. Pat. No. 4,706,208 discloses that printed circuit boards can be tested by maintaining operational power on the printed circuit boards and cycling the environmental chamber through temperatures which simulate system testing, insulation, and normal use. It has also been the general practice in the electronic industry to place circuit boards containing electronic devices in a high temperature environmental test chamber and to vary the supply voltages to those circuit boards within the normal operating tolerances established for the devices on the printed circuit boards.

Whereas the prior art burn-in techniques have functioned well to produce products which have acceptable infant failure levels, the amount of time taken is normally measured in days or weeks. From a manufacturing point of view, these prior art burn-in periods are expensive because delays in producing the product, increased inventory cost, and added associated manufacturing expenses. Most importantly, however, prior art burn-in periods are not compatible with high velocity manufacturing and just-in-time (JIT) processes. The JIT process requires that the various parts needed to build a complex piece of electronic gear such as a modern telecommunications system arrive at the manufacturing plant almost simultaneously and that the complete electronic system is produced in a matter of a few days, often as short as four or five days. Since large amounts of time are required to assembly circuit boards, there is not sufficient time to use prior art burn-in times to reduce the infant failure levels. Further, burn-in of the individual electronic parts before they are assembled into printed circuit boards has shown only limited success because defective circuit boards are still found after assembly or after delivery to the customer.

Hence, there exists a long-felt need among electronic system manufacturers for a method which would reduce the time needed to perform burn-in or environmental stress screening.

SUMMARY OF THE INVENTION

The foregoing problem is solved by a method that involves stressing assembled circuit boards well beyond normal operational limits both with respect to supply voltage and temperature cycling. After many hours of experimenting, unexpected results have been achieved where the circuit boards are transferred between a cold bath of inert liquid and a hot bath of inert liquid while the power voltage is being applied for short periods of time at voltages which exceed the nominal voltages of the devices. It has been found through long experiments that if the circuit boards are transferred from the hot bath to the cold bath of vice versa in less than 30 seconds, the maximum stresses are achieved in all parts without damaging part or the circuit boards. Most importantly, this new method satisfies the long-felt need of electronic system manufactures since the method requires less than 30 minutes of environmental stress screening to achieve a better level of infant failures than was achieved by the prior art burn-in techniques for much longer periods of time.

Other and further aspects of the present invention will become apparent during the course of the following description and by reference to the accompanying drawings.

DETAILED DESCRIPTION

Figure 1:
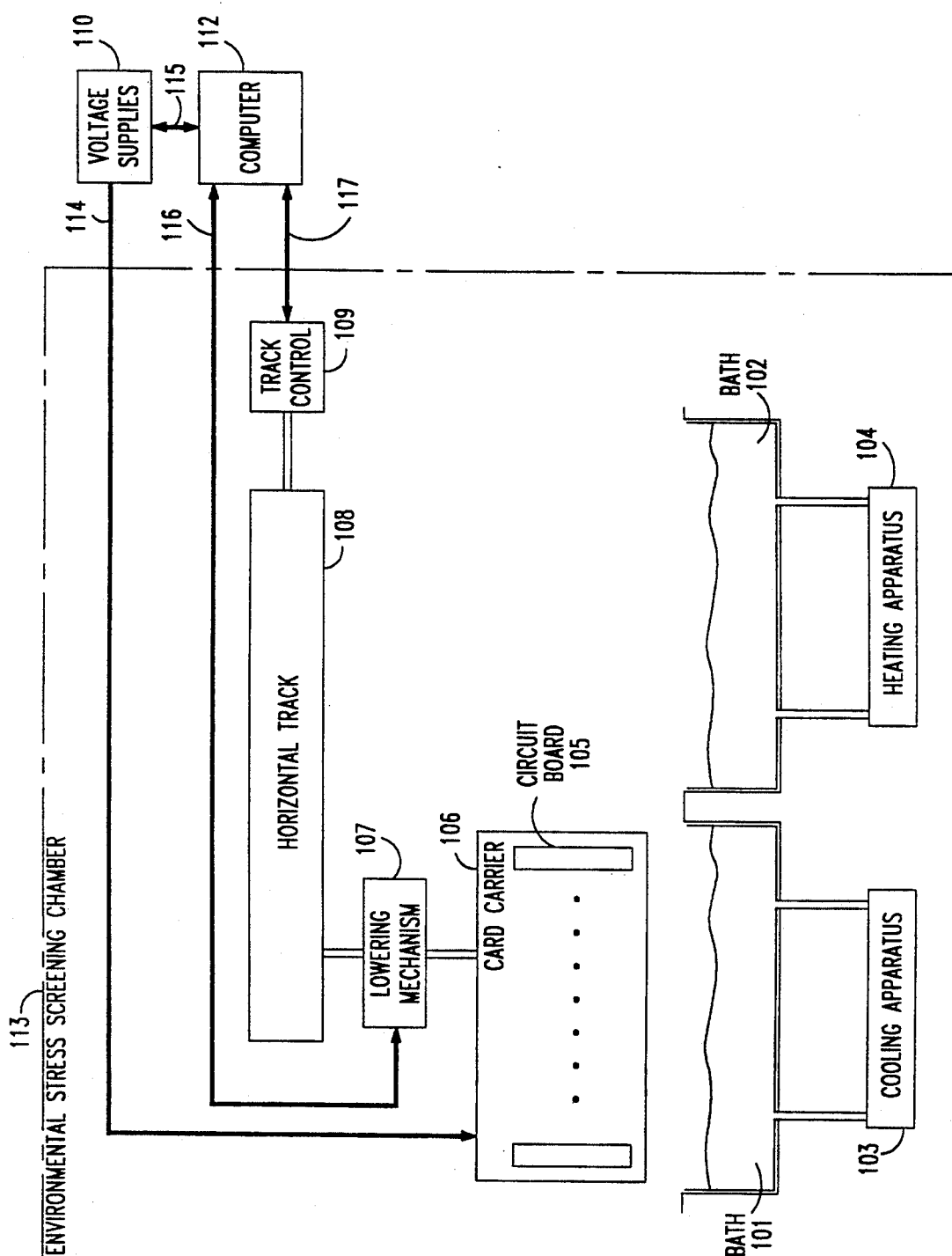
FIG. 1 illustrates, in block diagram, form the environmental screening chamber for practicing the invention.
Figure 3:
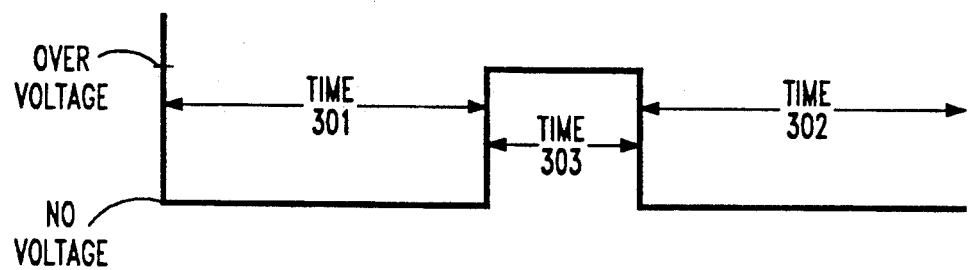
FIGS. 3 and 4 illustrate the manner in which supply voltages are applied to circuit boards during the stress process.

FIG. 1 illustrates, in block diagram form, environmental stress screening chamber 113 which is controlled by computer 112. Card carrier 106 contains a plurality of circuit boards such as circuit board 105 which are going to be stressed. Computer 112 controls the power voltages for the circuit boards in card carrier 106 by controlling voltage supplies 110 which supply voltage to card carrier 106 via cable 114. The testing method is to first insert card carrier 106 into bath 101 by actuation of lowering mechanism 107 by computer 112. Bath 101 is referred to as the cold bath and advantageously may be maintained at a temperature of −20° C. After the card carrier 106 is in bath 101 for a predefined amount of time, computer 112 actuates voltage supplies 110 to apply extreme voltages as illustrated in FIG. 3 to the circuit boards within card carrier 106. As illustrated in FIG. 3, no voltages are applied until time 303. During time 301, the circuit boards are allowed to reach the temperature of bath 101. This is done to simulate the "arctic" condition which can occur when power is first applied to a system. After card carrier 106 has been in bath 101 for time 303, voltages are removed from card carrier 106. After time 302, card carrier 106 is removed from bath 101 by actuation of lowering mechanism 107 and positioned over bath 102 by actuation of horizontal track 108 by track control 109 under control of computer 112. Bath 102 is referred to as the hot bath and advantageously may be maintained at a temperature of 85° C.

Figure 4:
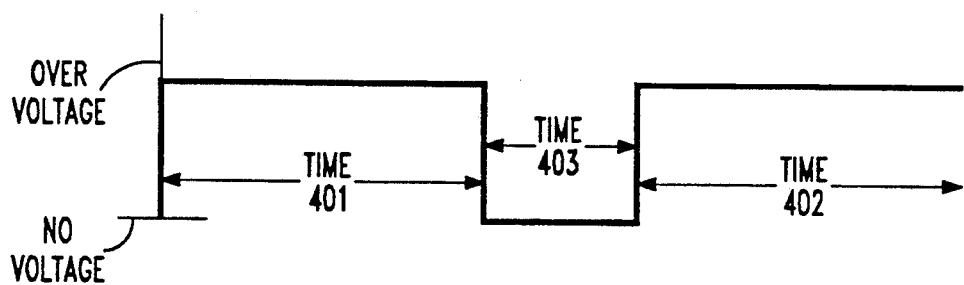

Card carrier 106 is then lowered into bath 102 by actuation of lowering mechanism 107. As soon as card carrier 106 is submerged in bath 102, computer 112 actuates voltage supplies 110 via cable 115 to supply extreme voltages as illustrated in FIG. 4. After card carrier 106 has been in bath 102 for time 401, voltage supplies 110 are deactivated for time 403. After time 402, card carrier 106 is removed from bath 102 and repositioned back over bath 101. After this cycle has been performed for the designated number of times, card carrier 106 is removed from the environmental stress screening chamber 113 and is replaced by another card carrier having a new set of circuit boards to be processed.

Environmental stress screening chamber 113 is illustrated only in block diagram form and does not show the mechanism for recovering the inert liquids in bath 101 and 102 which will be released into the interior of the screening chamber.

Figure 2:
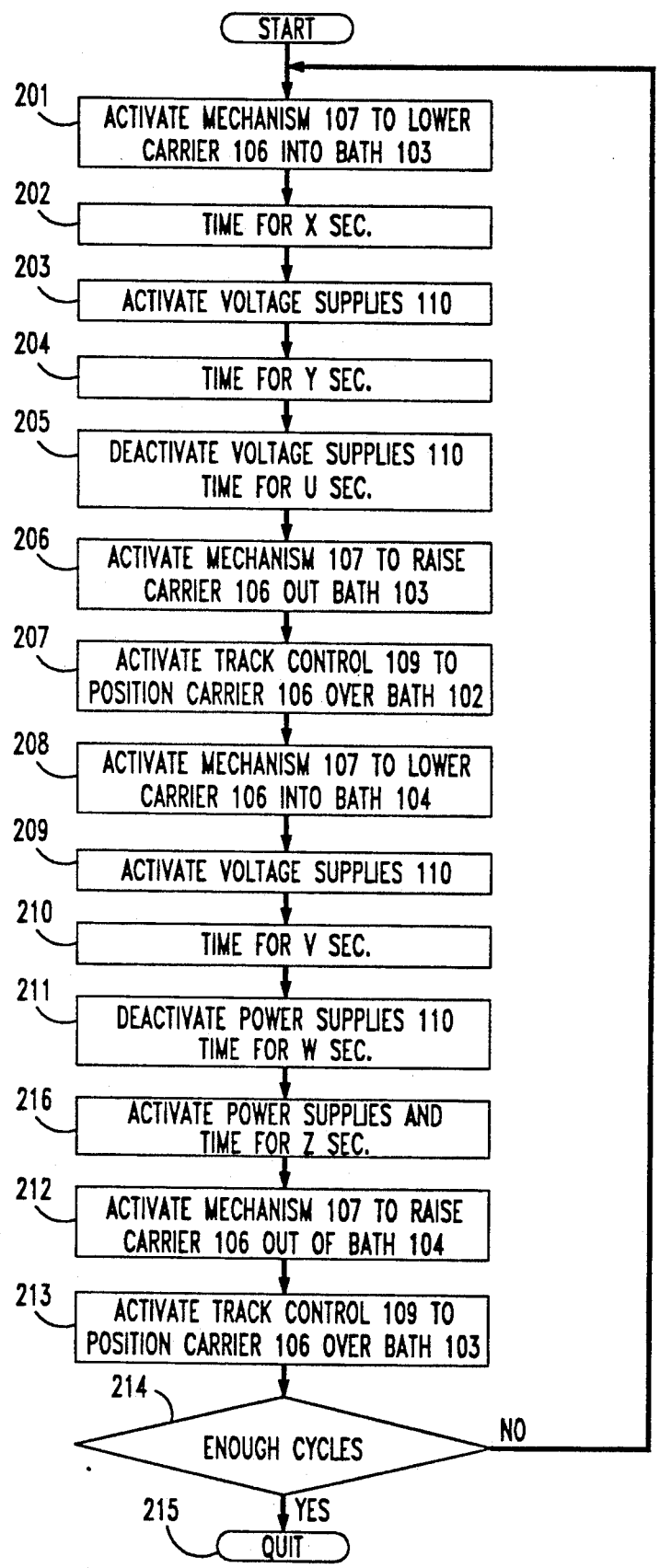
FIG. 2 illustrates, in flow chart form, a program to control the environmental testing chamber.

FIG. 2 illustrates, in flowchart form, a program for controlling computer 112. At the start of each cycle, block 201 is executed to activate lowering mechanism 107 so that carrier 106 is placed into bath 103. Block 202 then times for X seconds which advantageously may be 30 seconds (time 301 of FIG. 3). After this time has elapsed, block 203 is executed to actuate voltage supplies 110 to increase the nominal 5 volts supply up to 7.5 volts and the other voltages are increased up to 10% above their nominal value. This amount of voltage increase is far in excess of the normal operating margins allowed on the power voltages.

After block 204 has timed for Y seconds (time 303 of FIG. 3) which may be 5 seconds, block 205 is executed to deactivate voltage supplies 110. After U seconds (time 302 of FIG. 3) has elapsed, block 206 actuates mechanism 107 to raise card carrier 106 out of bath 103, and block 207 is actuated so that track control 109 repositions card carrier 106 over bath 102. U may be 25 seconds.

Block 208 is then executed to lower card carrier 106 into bath 104. As soon as card carrier 106 is submerged in bath 104, block 209 is activated to supply the high voltages to the circuit boards in card carrier 106. Block 210 then times for V seconds (time 401 of FIG. 4) which may be 30 seconds. At the end of this time period, block 211 is executed to deactivate voltage supplies 106 and time for W seconds (time 403 of FIG. 4) which may be 5 seconds. After V seconds, block 216 activates voltage supplies 110 to supply over voltage for Z seconds (time 402 of FIG. 4) which may be 30 seconds. After Z seconds, voltage supplies 110 are deactivated, block 212 is executed to raise the card carrier 106 from bath 104. Finally, block 213 is executed to activate track control 109 to position card carrier 106 over bath 103. Decision block 214 is executed to determine if enough cycles have been performed. If enough cycles have been performed, block 215 is executed to quit the stress process on this particular card carrier, and the operator is given time to remove the card carrier from the environmental stress screening chamber 113 and to replace this card carrier with a new card carrier. If enough cycles have not been performed, then block 201 is executed to commence the execution of the stress screening test on card carrier 106. The number of cycles may be 9. Testing has shown that the time required to transfer card carrier 106 from bath 101 to bath 102 should be less than 18 seconds.

In order to validate the environmental stress screening process of the invention, extensive field testing was required under a variety of field conditions. One of these tests is described in the following paragraphs. Two lots of circuit cards were tested in the following manner and then carefully tracked under actual field usage. The circuit cards were of four different types and were high density, through hole technology circuit cards using surface mount technology to mount components on both sides of the circuit cards. After operational being assembled, both lots were operationally pretested, and the operational pretesting found that 0.5% of the circuit cards failed. After pretesting, both lots were subjected to standard burn-in for a 152 hours and operationally retested. Both lots suffered an approximate 2% failure rate after the standard burn-in. One lot was then inserted into electronic systems and shipped to the field.

The second lot was stressed using the embodiment of the invention previously described and operationally retested. The operational retesting determined that an approximately 2% failure rate had occurred. The second lot was then stressed using standard burn-in for another 120 hours which resulted in no failures. The second lot was inserted into electronic system sand shipped to the field. No failures of circuit cards of the second lot were reported after one year. However, the first lot suffered an approximate 2% failure rate in the field. The field test confirmed that the process of the invention could detect circuit cards which would fail within a year after normal burn-in. In addition, extensive analysis of circuit cards which failed during testing in accordance with invention has shown that these failures were due to defective components and not due to good components failing because of over stressing.

The previous paragraphs have set forth time periods for U, S, Y, W, and V as while as a transfer time between baths 101 and 102. Those skilled in the art could determine time periods shorter or longer than time periods set forth. Indeed, extensive testing has shown that depending on electronic components, other time periods can give acceptable results. Similarly, different voltage ranges may be used for the voltage power supplies. Also, the number of cycles may be varied.

We claim:

1. A method for environmental stress screening electronic circuit boards mounted in a carrier, the method comprises the steps of:

(A) immersing the carrier in a cold bath of an inert liquid;

(B) applying power supply voltages to the electronic circuit boards in excess of the maximum operational voltages upon a first predefined period of time elapsing;

(C) removing the power supply voltages from the electronic circuit boards;

(D) transferring the carrier from the cold bath to a hot bath of the inert liquid within a second predefined period of time;

(E) applying the power supply voltages to the electronic circuit boards in excess of the maximum operational voltage as the carrier is immersed in the hot bath;

(F) removing the power supply voltages from the electronic circuit boards; and (G) repeating steps A through F for a predefined number of cycles.

2. The method of claim 1 wherein said cold bath is maintained at a temperature of less than 0° C.

3. The method of claim 1 wherein said hot bath is maintained at a temperature of in excess of 65° C.

4. The method of claim 1 wherein the second predefined period of time is less than 30 seconds.

5. The method of claim 4 wherein the predefined number of cycles is less than 10 cycles.

6. A process for environmental stress screening electronic circuit boards, the process comprises the steps of:

(A) mounting electronic components onto circuit boards to form electronic circuit boards;

(B) inserting the electronic circuit boards into a carrier;

(C) immersing the carrier into a cold bath of an inert liquid;

(D) applying power supply voltages to the electronic circuit boards in excess of the maximum operational voltages upon a first predefined period of time elapsing;

(E) removing the power supply voltages from the electronic circuit boards;

(f) transferring the carrier from the cold bath to a hot bath of inert liquid within a second predefined period of time;

(G) applying the power supply voltages to the electronic boards in excess of the maximum operational voltages upon the carrier being immersed into the hot bath;

(H) removing the power supply voltages of the electronic circuit boards;

(I) repeating steps A through F for a predefined number of cycles;

(J) performing a operational test on the electronic circuit boards to determine which of the electronic circuit boards are still fully operational.

7. The method of claim 6 wherein said cold bath is maintained at a temperature of less than 0° C.

8. The method of claim 6 wherein said hot bath is maintained at a temperature of in excess of 65° C.

9. The method of claim 6 wherein the second predefined period of time is less than 30 seconds.

10. The method of claim 9 wherein the predefined number of cycles is less than 10 cycles.

* * * * *